United States Patent
Nowotnick et al.

(10) Patent No.: US 9,301,388 B2
(45) Date of Patent: Mar. 29, 2016

(54) PRINTED CIRCUIT BOARD, METHOD OF PRODUCING A PRINTED CIRCUIT BOARD AND TESTING DEVICE FOR TESTING A PRINTED CIRCUIT BOARD

(75) Inventors: Jens Nowotnick, Reutlingen (DE); Walter Wagenbrenner, Tamm (DE); Ulrich Warmbold, Hildesheim (DE); Matthias Lausmann, Murr (DE); Sven Heinemann, Braunschweig (DE); Holger Gebhardt, Salzgitter (DE); Bernhard Klante, Cremlingen (DE)

(73) Assignee: Robert Bosch GmbH, Stuttgart (DE)

( * ) Notice: Subject to any disclaimer, the term of this patent is extended or adjusted under 35 U.S.C. 154(b) by 75 days.

(21) Appl. No.: 13/977,565

(22) PCT Filed: Dec. 20, 2011

(86) PCT No.: PCT/EP2011/073363
§ 371 (c)(1),
(2), (4) Date: Jun. 28, 2013

(87) PCT Pub. No.: WO2012/089555
PCT Pub. Date: Jul. 5, 2012

(65) Prior Publication Data
US 2013/0271177 A1    Oct. 17, 2013

(30) Foreign Application Priority Data

Dec. 28, 2010   (DE) .......................... 10 2010 064 261
Feb. 15, 2011   (DE) .......................... 10 2011 004 106

(51) Int. Cl.
*H05K 1/02*       (2006.01)
*H05K 3/10*       (2006.01)
(Continued)

(52) U.S. Cl.
CPC ............... *H05K 1/0268* (2013.01); *H05K 3/10* (2013.01); *H05K 3/3452* (2013.01); *H05K 3/4007* (2013.01); *H05K 2201/099* (2013.01); *H05K 2203/0415* (2013.01); *Y10T 29/49155* (2015.01)

(58) Field of Classification Search
CPC .... H05K 1/0268; H05K 3/3452; H01L 24/03; H01L 24/05; H01L 24/06; H01L 24/10; H01L 24/13; H01L 24/48; G01R 31/2884
USPC ............. 324/763.01, 754.03, 750.25; 257/48, 257/737, 784, E23.02; 174/250, 255; 29/846
See application file for complete search history.

(56) References Cited

U.S. PATENT DOCUMENTS 4,633,176 A * 12/1986 Reimer ................... 324/750.25
5,877,033 A    3/1999 Matern
(Continued)

FOREIGN PATENT DOCUMENTS

JP           8046311        2/1996

OTHER PUBLICATIONS

International Search Report for Application No. PCT/EP2011/073363 dated Apr. 2, 2012 (3 pages).

*Primary Examiner* — Tung X Nguyen
*Assistant Examiner* — David Frederiksen
(74) *Attorney, Agent, or Firm* — Michael Best & Friedrich LLP

(57) ABSTRACT

The invention relates to a printed circuit board (10), with conductor tracks (11, 11a), which are arranged at least on a surface of the printed circuit board (10) and serve for the electrical contacting of components, and with at least one testing zone (12), which is formed by a portion of the conductor track (11) and serves for the electrical contacting of a testing element (20), in particular a testing head, wherein the surface of the printed circuit board (10) is provided with a protective layer (14), which is formed in the testing zone (12) such that it is interrupted in the region of a contact zone (15), and wherein the contact zone (15) is provided with a layer (18), which establishes an electrical contacting of the testing element (20) with the layer (18). According to the invention, it is provided that the contact zone (15) is arranged at least partially at a lateral distance from the edges of the conductor track (11) in the region of the testing zone (12).

12 Claims, 2 Drawing Sheets

(51) Int. Cl.
*H05K 3/34* (2006.01)
*H05K 3/40* (2006.01)

(56) References Cited

U.S. PATENT DOCUMENTS

| | | | | |
|---|---|---|---|---|
| 6,897,669 | B2 * | 5/2005 | Ishio et al. | 257/48 |
| 7,294,930 | B2 * | 11/2007 | Tanabe | 257/737 |
| 2003/0173667 | A1 * | 9/2003 | Yong et al. | 257/748 |
| 2003/0197289 | A1 | 10/2003 | Lin | |
| 2004/0069988 | A1 * | 4/2004 | Lin et al. | 257/48 |
| 2004/0089954 | A1 * | 5/2004 | Hembree et al. | 257/780 |
| 2004/0124861 | A1 * | 7/2004 | Zaerpoor | G01R 1/0735 324/756.04 |
| 2005/0205865 | A1 * | 9/2005 | Kuan et al. | 257/48 |
| 2007/0245554 | A1 | 10/2007 | Salmon | |
| 2007/0296429 | A1 * | 12/2007 | Nagamatsu | G01R 1/0466 324/750.3 |
| 2008/0203577 | A1 * | 8/2008 | Fukamizu | H01L 24/05 257/773 |
| 2009/0009205 | A1 * | 1/2009 | Kazama | 324/761 |
| 2009/0113704 | A1 * | 5/2009 | Toyoda | 29/850 |
| 2010/0012356 | A1 | 1/2010 | Hasegawa | |
| 2011/0025358 | A1 * | 2/2011 | Kazama et al. | 324/755.01 |

* cited by examiner

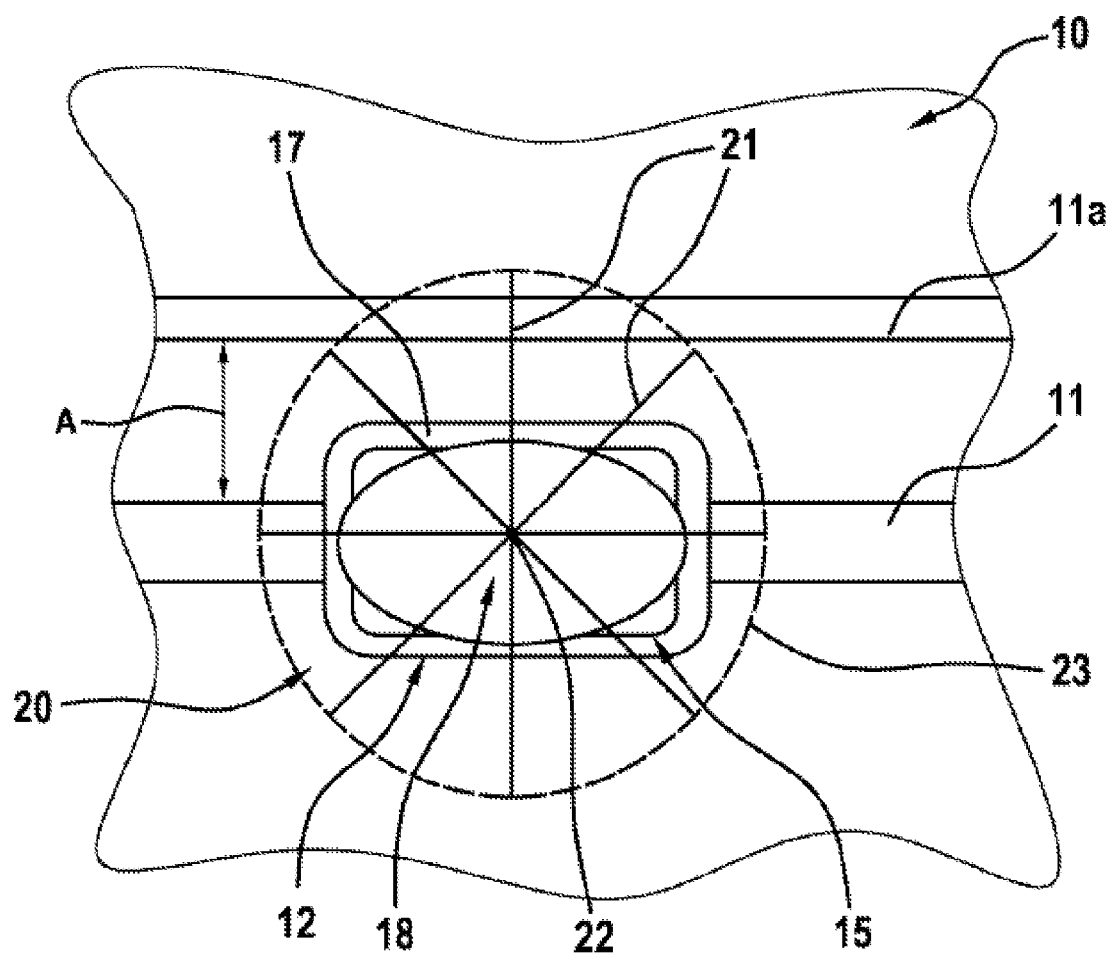

PRINTED CIRCUIT BOARD, METHOD OF PRODUCING A PRINTED CIRCUIT BOARD AND TESTING DEVICE FOR TESTING A PRINTED CIRCUIT BOARD

BACKGROUND OF THE INVENTION

The invention relates to a printed circuit board. Further, the invention relates to a method for producing a printed circuit board and a testing device for testing a printed circuit board.

A printed circuit board is already known in practice. Printed circuit boards of this known kind are populated with electrical and electronic components which form a circuit of an engine control unit, for example. In the manufacturing process of the printed circuit board and after populating the printed circuit board with the electrical and electronic components, the function of the printed circuit board or of the circuit must be tested in order to be able to exclude incorrect population or component defects. In practice, this is carried out by means of pin-shaped testing heads, which make electrical contact with the printed circuit board in the region of test zones in order to thereby be able to test resistances, for example, between certain points of the circuit or similar. These test zones are formed by areas of the printed circuit tracks in which, in contrast to other areas of the printed circuit tracks which are only used to carry current, no protective layer in the form of a solder resist varnish has previously been applied to the printed circuit track. Furthermore, the test zone is provided with a solder layer in order to guarantee that the test zone makes good electrical contact with a mentioned pin-shaped testing head.

With the printed circuit boards known in practice, no solder resist varnish is applied over the whole width of the printed circuit track in the region of the test zone. Further, the solder layer covers the whole width of the test zone. A problem here is that the solder layer can penetrate a region outside the printed circuit track. This is particularly problematic when, due to the usually close spacing of the printed circuit tracks, the solder layer cannot be prevented from finding its way into the region of a printed circuit track adjacent to the test zone so that electrical short circuits can occur. In particular, the trend towards ever smaller distances between the printed circuit tracks, which are necessary in order to achieve higher circuit densities, therefore requires much closer tolerances with regard to the application of the solder layer as well as stricter quality checks for checking that there are no short circuits to the printed circuit tracks adjacent to the test zone, both measures which burden the production of a printed circuit board with additional costs.

SUMMARY OF THE INVENTION

Starting from the stated prior art, the invention is based on the object of improving a known printed circuit board in such a way that, on the one hand, the circuit in the region of the test zone can be safely tested by the testing head and that, on the other hand, the solder layer is at the same time prevented from finding its way onto the region of the printed circuit board adjacent to the test zone, in particular onto adjacent printed circuit tracks. In doing so, the invention is based on the idea of forming an intermediate space between the contact region, which constitutes the region in the test zone in which there is no solder resist varnish, and the edges of the printed circuit track in the region of the test zone. The said solder resist varnish is disposed in this intermediate space. This ensures that, even when it finds its way into a region outside the contact region, the solder layer does not overrun the region of the printed circuit track in the region of the test zone and is therefore also unable to penetrate the region of adjacent printed circuit tracks. In other words, this means that the size of the contact zone (which is free from solder resist varnish) is matched to the size of the test zone in such a way that the contact zone is arranged at a distance inside the test zone.

In order, when viewed overall, to be able to form printed circuit tracks on the printed circuit board which are as narrow as possible so that a high component density can be achieved and, on the other hand, to enable a reliable contact with the testing element, which in particular is designed as a pin-shaped testing head, in the region of the test zone, in a particularly preferred embodiment of the invention it is provided that the printed circuit track has a width in the region of the test zone which is greater than the width of the printed circuit track outside the test zone.

In an embodiment, which can be produced particularly easily, it is at the same time proposed that the test zone and the contact region which has been freed from the protective layer are in each case substantially rectangular in shape.

It has been shown that geometric sizes of the contact zone for making contact with the testing element have proved of value in practice when they have a width of 0.3 mm and a length of 0.5 mm. At the same time, a width of 0.45 mm and a length of 0.65 mm have been shown to be advantageous for the test zone.

In order to enable the testing element to make reliable contact in the contact zone in spite of the protective layer, it is also particularly preferably provided that the solder layer forms an elevation which projects above the protective layer of the printed circuit board in an upward direction.

As a result of the last-mentioned embodiment of the solder layer, it is also possible for the test zone to have a lateral spacing from at least one other printed circuit track which is less than the diameter or the radius of the testing element so that, when the testing element is placed on the contact zone, the other printed circuit track is covered by the testing element, wherein the testing element does not make electrical contact with the other printed circuit track. This enables very close arrangements of the printed circuit tracks to be realized, the spacing of which is determined only by the manufacturing tolerances during the production of the printed circuit board and not by the presence or sizing of a testing element.

The invention also includes a method for producing a printed circuit board according to the invention. Here, it is provided that printed circuit tracks are formed on a surface of the printed circuit board with at least one test zone, that the surface of the printed circuit board is then provided with a protective layer, in particular in the form of a solder resist varnish, wherein no solder resist varnish is applied at least in the region of the contact zone, and wherein the contact zone is arranged within the test zone formed by the printed circuit track with lateral spacing in at least some areas. In doing so, such a freeing of the test zone from the layer of protective medium is achieved, for example, by using an appropriate mask which covers the contact zone. In particular, as a result, it is also unnecessary for the test zone or the contact zone to be only freed from the protective layer or the solder resist varnish retrospectively.

For making reliable electrical contact between the testing element and the printed circuit track, it is also provided that a solder layer is applied in the region of the contact zone after applying the protective layer.

Furthermore, the invention includes a testing device for testing a printed circuit board according to the invention. Here, it is quite particularly preferably provided that the testing device has a testing head which is designed in cross section in the form of a star with ribs in the region which comes into contact with the contact zone. A testing head designed in this way enables a particularly reliable contact to be made with the contact zone, as the ribs to a certain extent bury themselves in the solder layer so that a relatively large contact surface is achieved between the testing head and the solder layer or the printed circuit track.

BRIEF DESCRIPTION OF THE DRAWINGS

Further advantages, characteristics and details of the invention can be seen from the following description of preferred exemplary embodiments and with reference to the drawing.

In the drawing:

FIG. 3 shows the printed circuit board according to FIGS. 1 and 2 after applying a solder layer during a testing operation for checking the printed circuit board which carries a circuit, likewise in plan view.

The same components or components with the same function are allocated the same reference numbers in the figures.

DETAILED DESCRIPTION

Figure 1:
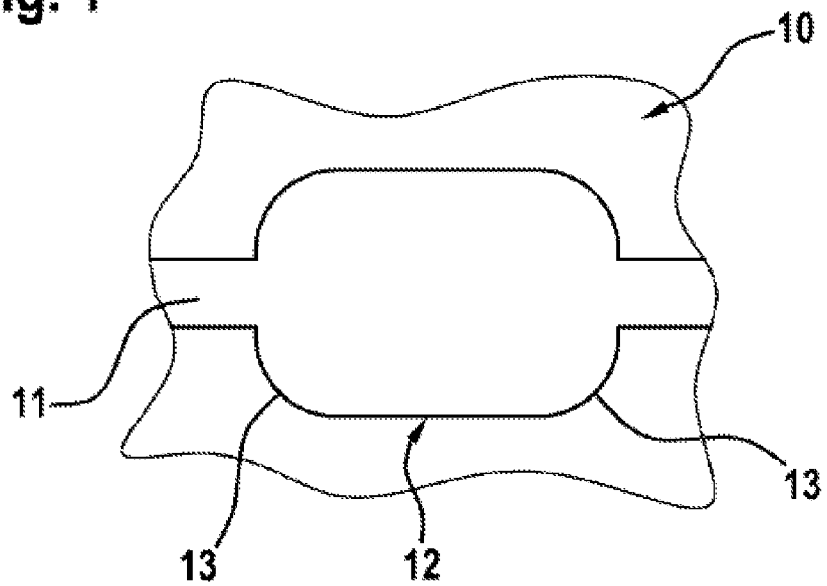
FIG. 1 shows a printed circuit board according to the invention in the region of a test zone before applying a protective layer in the form of a solder resist varnish in plan view.
Figure 2:
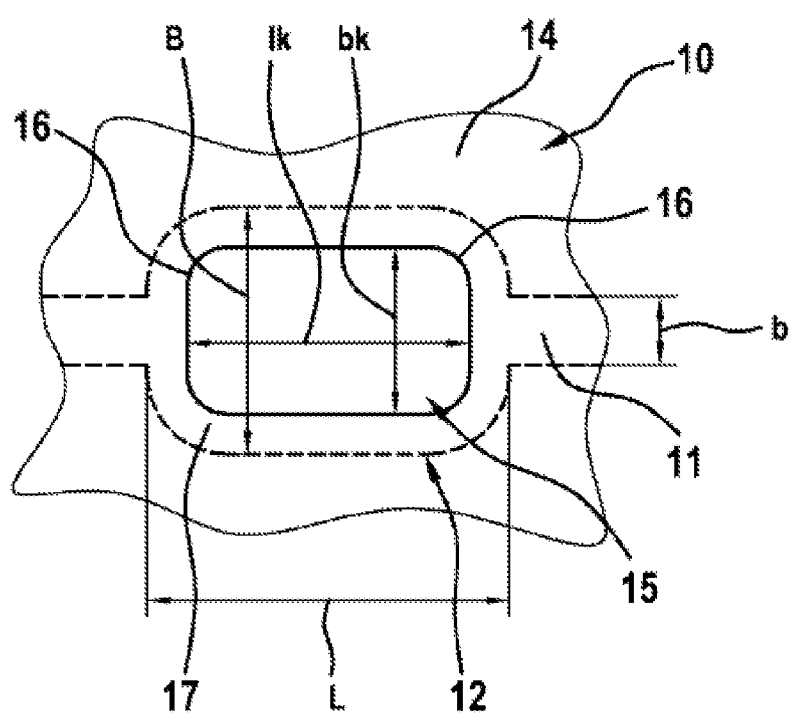
FIG. 2 shows the printed circuit board according to FIG. 1 after applying the solder resist varnish, wherein a contact region which interacts with a testing device is free from solder resist varnish, likewise in plan view.

By way of example, the top side of a printed circuit board 10 in the region of a printed circuit track 11 during the production process of the printed circuit board 10 is shown in FIGS. 1 and 2. Here, the printed circuit board 10 is in particular designed as a circuit carrier for a control unit such as is used in the automotive industry, e.g. as an engine control unit. Furthermore, a printed circuit board 10 of this kind is populated with or electrically connected to a multiplicity of electrical or electronic components, which are not shown in the figures, which when viewed as a whole form a circuit.

The printed circuit track 11 normally has a width b. On the other hand, the printed circuit track 11 is wider in a test zone 12 of the printed circuit board 10, wherein it has a width B of 0.45 mm for example. The test zone 12 has a substantially rectangular form with rounded corners 13. The printed circuit track 11 is usually in particular made of copper.

The state of the printed circuit board 10 in the region of the printed circuit track 11 at a later production time, such as is present after applying a protective layer 14, in particular in the form of a so-called solder resist varnish, is shown in FIG. 2. Here, the solder resist varnish has the function of covering and protecting the surface of the printed circuit tracks 11 and the printed circuit board 10 so that the printed circuit tracks 11 in particular do not tend to corrode. Further, the solder resist varnish curtails the wetting of the surfaces covered thereby, in particular by solder, or prevents this so that solder substantially only adheres in the regions of the printed circuit board 10 which are provided for this purpose and in which no solder resist varnish is applied.

An essential feature of the invention is that a contact zone 15 is formed within the test zone 12 in which no protective layer 14, that is to say no solder resist varnish, is present. This can be realized in practice by means of an appropriate mask which covers the zones of the printed circuit board 10 which are to be kept free from solder resist varnish, and therefore prevents the corresponding contact region 15 being wetted by the protective layer 14 or the solder resist varnish.

An essential feature of the invention is also that the contact zone 15 is arranged within the test zone 12. In particular, it is provided that the contact zone 15 has a shape which is matched to the shape of the test zone 12, i.e. in particular it is also rectangular with rounded corners 16. Here, the contact zone 15 is preferably positioned or aligned within the test zone 12 in such a way that this results in a uniformly wide edge strip 17 between the contact zone 15 and the edge regions of the test zone 12 or the printed circuit track 11. While the length L of the test zone 12 is 0.65 mm, for example, the length lk of the contact zone 15 is 0.5 mm for example. Furthermore, the width bk of the contact zone 15 is 0.30 mm. The dimensions given for the test zone 11 and the contact zone 15 have been shown to be advantageous in practice in as far as these dimensions can be controlled or reproduced with the manufacturing tolerances present in large-scale production. However, the length and width ratios between the contact zone 15 and the test zone 12 also appear to be important regardless of the respective absolute size.

After applying the protective layer 14 or the solder resist varnish to the surface of the printed circuit board 10 and freeing the contact zone 15 from the solder resist varnish, the contact zone 15 (as well as other regions of the printed circuit board 10 or of the printed circuit tracks 11 in which the printed circuit board 10 is to be populated with components) is provided with a solder layer 18. As disclosed in the prior art, this is carried out, for example, by means of a mask which has cutouts for the regions to be provided with the solder layer 18. Solder paste is applied in the cutouts of the mask, for example by means of squeegee. After removing the mask, the printed circuit board 10 is fed to a reflow machine so that the solder paste forms in the shape of solder beads which are referred to in conjunction with the invention as solder layer 18.

The solder layer 18 shown in FIG. 3 is shown here as a three-dimensional elevation. Preferably, an attempt is made to align the solder layer 18 exactly with the contact zone 15 and the test zone 12. At the same time, the contact zone 15 which is free from solder resist varnish ensures that the solder layer 18 only adheres in the region of the contact zone 15. If, as shown in FIG. 3, the solder layer 18 should extend beyond the contact zone 15, then the solder layer 18 only reaches the edge of the test zone 12 as a maximum and does not overrun this due to the sizing of the test zone 12 and the contact zone 15.

A second printed circuit track 11a is also shown in FIG. 3. This printed circuit track 11a is arranged at a distance A from the printed circuit track 11. The outline of a testing element 20, which is preferably in the form of a testing head, can also be seen in FIG. 3. The testing head or the testing element 20 is electrically connected to a control unit (not shown) and to the test zone 12, in particular to the solder layer 18 in the contact zone 15. This is achieved by lowering the testing element 20 onto the solder layer 18. On the side facing the solder layer 18, the testing element 20 preferably has a multiplicity of ribs 21 which are arranged relative to one another in the form of a star about a midpoint 22. Further, it can be seen from FIG. 3, that the external outline of the testing element 20, which is indicated by the dashed line 23, is arranged to overlap the printed circuit track 11a. In spite of this, the testing element 20 does not make electrical contact with the printed circuit track 11a, as the solder layer 18 has such a height or thickness that the (lowered) testing element 20 does not at the same time make contact with the printed circuit track 11a. The distance A can therefore be chosen to be smaller than the diameter or the radius of the testing element 20.

The described printed circuit board 10 according to the invention can be varied or modified in many ways without deviating from the concept of the invention. This consists in the provision or design of a contact zone 15, the size of which is such that it lies within a test zone 12, wherein a protective layer 14 is arranged between the contact zone 15 and the edges of the test zone 12.

The invention claimed is:

1. A printed circuit board (10), having printed circuit tracks (11, 11a) which are arranged on at least one surface of the printed circuit board (10) and are used to make electrical contact with components, and having at least one test zone (12) which is formed by a section of a printed circuit track (11) and is used to make electrical contact with a testing element (20), wherein the surface of the printed circuit board (10) is provided with a protective layer (14), which is interrupted in the test zone (12) in the region of a contact zone (15), and wherein the contact zone (15) is provided with a layer (18) which is exposed to make an electrical contact between the testing element (20) and the layer (18), characterized in that the contact zone (15) is arranged at least partially with lateral spacing from edges of the printed circuit track (11) in the region of the test zone (12), wherein the layer (18) forms an elevation which projects above the protective layer (14) of the printed circuit board (10) in an upward direction and the test zone (12) has a lateral spacing (A) from at least one other printed circuit track (11a) which is less than the radius of the testing element (20) so that, when the testing element (20) is placed on the contact zone (15), the other printed circuit track (11a) is covered by the testing element (20), wherein the testing element (20) does not make electrical contact with the other printed circuit track (11a).

2. The printed circuit board as claimed in claim 1, characterized in that the printed circuit track (11) has a width (B) in the region of the test zone (12) which is greater than a width (b) of the printed circuit track (11) outside the test zone (12).

3. The printed circuit board as claimed in claim 1, characterized in that the test zone (12) and the contact zone (15) which has been freed from the protective layer (14) are substantially rectangular in shape.

4. The printed circuit board as claimed in claim 3, characterized in that the contact zone (15) has a width (bk) of 0.30 mm and a length (lk) of 0.50 mm, and the test zone (12) has a width (B) of 0.45 mm and a length (L) of 0.65 mm.

5. A method for producing a printed circuit board (10) as claimed in claim 1, wherein the printed circuit tracks (11, 11a) are formed on a surface with at least one test zone (12), that the surface of the printed circuit board (10) is then provided with a protective layer (14), wherein no protective layer (14) is applied at least in the region of the contact zone (15), and wherein the contact zone (15) is arranged within the test zone (12) formed by the printed circuit track (11) with lateral spacing in at least some areas.

6. The method as claimed in claim 5, characterized in that a layer (18) is applied in the region of the contact zone (15) after applying the protective layer (14).

7. The method as claimed in claim 6, characterized in that the layer (18) is designed with such a height that it projects above the protective layer (14).

8. The method as claimed in claim 5, wherein the protective layer (14) is a solder resist varnish.

9. The method as claimed in claim 5, characterized in that a solder layer is applied in the region of the contact zone (15) after applying the protective layer (14).

10. A testing device (20) for testing a printed circuit board (10) as claimed in claim 1, characterized in that the testing device (20) has a testing head which is designed in cross section in the form of a star with ribs (21) in the region which comes into contact with the contact zone (15) of the printed circuit board (10).

11. The printed circuit board as claimed in claim 1, wherein the testing element (20) is a testing head.

12. The printed circuit board as claimed in claim 1, wherein the protective layer (14) is solder resist varnish.

\* \* \* \* \*